(12) United States Patent
Nakano et al.

(10) Patent No.: US 11,302,829 B2
(45) Date of Patent: Apr. 12, 2022

(54) PHOTOVOLTAIC DEVICE AND METHOD FOR MANUFACTURING PHOTOVOLTAIC DEVICE

(71) Applicant: KANEKA CORPORATION, Osaka (JP)

(72) Inventors: Kunihiro Nakano, Settsu (JP); Kunta Yoshikawa, Settsu (JP); Takashi Kuchiyama, Settsu (JP)

(73) Assignee: KANEKA CORPORATION, Osaka (JP)

( * ) Notice: Subject to any disclaimer, the term of this patent is extended or adjusted under 35 U.S.C. 154(b) by 207 days.

(21) Appl. No.: 16/499,175

(22) PCT Filed: Dec. 22, 2017

(86) PCT No.: PCT/JP2017/046116
§ 371 (c)(1),
(2) Date: Sep. 27, 2019

(87) PCT Pub. No.: WO2018/179634
PCT Pub. Date: Oct. 4, 2018

(65) Prior Publication Data
US 2021/0111287 A1      Apr. 15, 2021

(30) Foreign Application Priority Data

Mar. 29, 2017   (JP) .............................. JP2017-065645

(51) Int. Cl.
*H01L 31/0216*   (2014.01)
*H01L 31/0224*   (2006.01)
*H01L 31/18*      (2006.01)

(52) U.S. Cl.
CPC .................. *H01L 31/02167* (2013.01); *H01L 31/022475* (2013.01); *H01L 31/022483* (2013.01); *H01L 31/186* (2013.01); *H01L 31/1884* (2013.01)

(58) Field of Classification Search
CPC ....... H01L 31/02167; H01L 31/022475; H01L 31/022483; H01L 31/186; H01L 31/1884;
(Continued)

(56) References Cited

U.S. PATENT DOCUMENTS

2010/0252089 A1\* 10/2010 Sportel ................ H01L 31/046
                                                                 136/244
2014/0024168 A1    1/2014  Goto et al.
(Continued)

FOREIGN PATENT DOCUMENTS

JP          2010-62084 A      3/2010
JP          2010-283408 A    12/2010
(Continued)

OTHER PUBLICATIONS

International Search Report for corresponding international application PCT/JP2017/046116 dated Mar. 20, 2018.

*Primary Examiner* — Mayla Gonzalez Ramos
(74) *Attorney, Agent, or Firm* — Hauptman Ham, LLP (57) ABSTRACT

A photovoltaic device according to the present disclosure includes: a first-conductivity-type semiconductor film provided on a back side of a semiconductor substrate; a second-conductivity-type semiconductor film in which at least a part thereof is provided in a position different, in plan view, from a position of the first-conductivity-type semiconductor film on the back side of the semiconductor substrate; a protective film, which is formed on a back side of the first-conductivity-type semiconductor film and a back side of the second-conductivity-type semiconductor film, and which includes a conductive portion and a non-conductive transformed portion; and an electrode film formed on a back side of the conductive portion. The transformed portion of the protective film is provided along a conduction path between a back surface of the first-conductivity-type semiconductor film and a back surface of the second-conductivity-type semiconductor film.

9 Claims, 9 Drawing Sheets

(58) Field of Classification Search
CPC ......... H01L 31/022441; H01L 31/0747; Y02E 10/50; Y02P 70/50
See application file for complete search history.

(56) References Cited

U.S. PATENT DOCUMENTS

| | | |
|---|---|---|
| 2014/0182675 A1 | 7/2014 | Tokuoka et al. |
| 2014/0224307 A1 | 8/2014 | Chen et al. |
| 2014/0373896 A1 | 12/2014 | Matsuura et al. |
| 2018/0076340 A1 | 3/2018 | Baba |

FOREIGN PATENT DOCUMENTS

| | | |
|---|---|---|
| JP | 2013-131586 A | 7/2013 |
| JP | 2013-239476 A | 11/2013 |
| JP | 2014-183073 A | 9/2014 |
| JP | 5820265 B2 | 11/2015 |
| JP | 2017-17219 A | 1/2017 |
| WO | 2012/132838 A1 | 10/2012 |
| WO | 2013/073045 A1 | 5/2013 |
| WO | 2013/145008 A1 | 10/2013 |
| WO | 2016/194301 A1 | 12/2016 |

* cited by examiner

PHOTOVOLTAIC DEVICE AND METHOD FOR MANUFACTURING PHOTOVOLTAIC DEVICE

CROSS REFERENCE TO RELATED APPLICATION

This application claims the priority of Japanese Patent Application No. 2017-065645, filed on Mar. 29, 2017, in the JPO (Japanese Patent Office). Further, this application is the National Phase Application of International Application No. PCT/JP2017/046116, filed on Dec. 22, 2017, which designates the United States and was published in Japan. Both of the priority documents are hereby incorporated by reference in their entireties.

TECHNICAL FIELD

The present invention relates to a photovoltaic device and a method of manufacturing a photovoltaic device.

BACKGROUND ART

In Patent Literature 1 described below, there is disclosed a solar cell including, on the back side of a semiconductor substrate, a first-conductivity-type semiconductor film and a second-conductivity-type semiconductor film laminated so as to overlap with the first-conductivity-type semiconductor film. A shared transparent electrode film is formed on back surfaces of the first-conductivity-type semiconductor film and the second-conductivity-type semiconductor film. The transparent electrode film is then separated by wet etching in a region in which the first-conductivity-type semiconductor film and the second-conductivity-type semiconductor film are overlapped with each other in order to avoid a short circuit between the first-conductivity-type semiconductor film and the second-conductivity-type semiconductor film.

CITATION LIST

Patent Literature

[PTL 1] JP 2013-131586 A

SUMMARY OF INVENTION

Technical Problem

However, the solar cell of the related art described above is low in long-term reliability and has a room for improvement. Specifically, in the configuration of the related art described above, in the region in which the first-conductivity-type semiconductor film and the second-conductivity-type semiconductor film are overlapped with each other, the transparent electrode film having a function of protecting the surfaces of the first-conductivity-type semiconductor film and the second-conductivity-type semiconductor film is removed by etching so that at least a part of the first-conductivity-type semiconductor film and the second-conductivity-type semiconductor film is exposed, with the result that the long-term reliability of the solar cell is lowered.

The present disclosure has been made in view of the above-mentioned problem, and an object of the present disclosure is to improve long-term reliability of the photovoltaic device.

Solution to Problem (1) A photovoltaic device according to the present disclosure includes: a first-conductivity-type semiconductor film provided on a back side of a semiconductor substrate; a second-conductivity-type semiconductor film in which at least a part thereof is provided in a position different, in plan view, from a position of the first-conductivity-type semiconductor film on the back side of the semiconductor substrate; a protective film, which is formed on a back side of the first-conductivity-type semiconductor film and a back side of the second-conductivity-type semiconductor film, and which includes a conductive portion and a non-conductive transformed portion; and an electrode film formed on a back side of the conductive portion, wherein the transformed portion of the protective film is provided along a conduction path between a back surface of the first-conductivity-type semiconductor film and a back surface of the second-conductivity-type semiconductor film.

(2) In the photovoltaic device according to Item (1) described above, the transformed portion may include a crack.

(3) In the photovoltaic device according to Item (1) or (2) described above, the protective film may contain, as its component, at least one material selected from a group consisting of indium oxide, zinc oxide, tin oxide, and titanium oxide.

(4) In the photovoltaic device according to Item (1) described above, the protective film may contain indium oxide, and the indium in the transformed portion may be subjected to reduction more than in other regions.

(5) In the photovoltaic device according to any one of Items (1) to (4) described above, the electrode film may contain, as its component, at least one material selected from the group consisting of copper and silver.

(6) A method of manufacturing a photovoltaic device, according to this disclosure, includes the steps of: forming a first-conductivity-type semiconductor film on a back side of a semiconductor substrate; forming a second-conductivity-type semiconductor film in which at least a part thereof is provided in a position different, in plan view, from a position of the first-conductivity-type semiconductor film on the back side of the semiconductor substrate; forming a protective film having a conductive portion on a back side of the first-conductivity-type semiconductor film and a back side of the second-conductivity-type semiconductor film; forming an electrode film on a back side of the conductive portion; and forming a non-conductive transformed portion in the protective film along a conduction path between a back surface of the first-conductivity-type semiconductor film and a back surface of the second-conductivity-type semiconductor film.

(7) The method of manufacturing a photovoltaic device according to Item (6) described above may be a method in which, in the step of forming the transformed portion, the transformed portion is formed by laser irradiation.

(8) The method of manufacturing a photovoltaic device according to Item (6) or (7) described above may be a method in which, in the step of forming the transformed portion, the electrode film is used as a mask to avoid forming the transformed portion in a connection portion of the protective film in which the protective film is connected to the electrode film.

(9) The method of manufacturing a photovoltaic device according to Item (7) described above may be a method in which, in the step of forming the transformed portion, the laser irradiation is performed on a portion of the protective film that is along the conduction path between the back surface of the first-conductivity-type semiconductor film and the back surface of the second-conductivity-type semiconductor film.

(10) The method of manufacturing a photovoltaic device according to Item (6) described above may be a method in which, in the step of forming the transformed portion, the transformed portion is formed by plasma treatment.

(11) The method of manufacturing a photovoltaic device according to Item (10) described above may be a method in which, in the method of forming the transformed portion, the plasma treatment is performed in a hydrogen atmosphere or a methane atmosphere.

(12) The method of manufacturing a photovoltaic device according to any one of Items (6) to (11) described above may be a method in which, in the step of forming the protective film, at least one material selected from the group consisting of indium oxide, zinc oxide, tin oxide, and titanium oxide is used to form the protective film.

(13) The method of manufacturing a photovoltaic device according to any one of Items (6) to (11) described above may be a method in which, in the step of forming the electrode film, copper or silver is used to form the electrode film.

(14) The method of manufacturing a photovoltaic device according to Item (13) described above may be a method in which, in the step of forming the electrode film, the electrode film is formed by electrolytic plating using copper as a material.

DESCRIPTION OF EMBODIMENTS

An embodiment of the present disclosure is described below with reference to the accompanying drawings.

[Configuration of a Photovoltaic Device 100]

Figure 1:
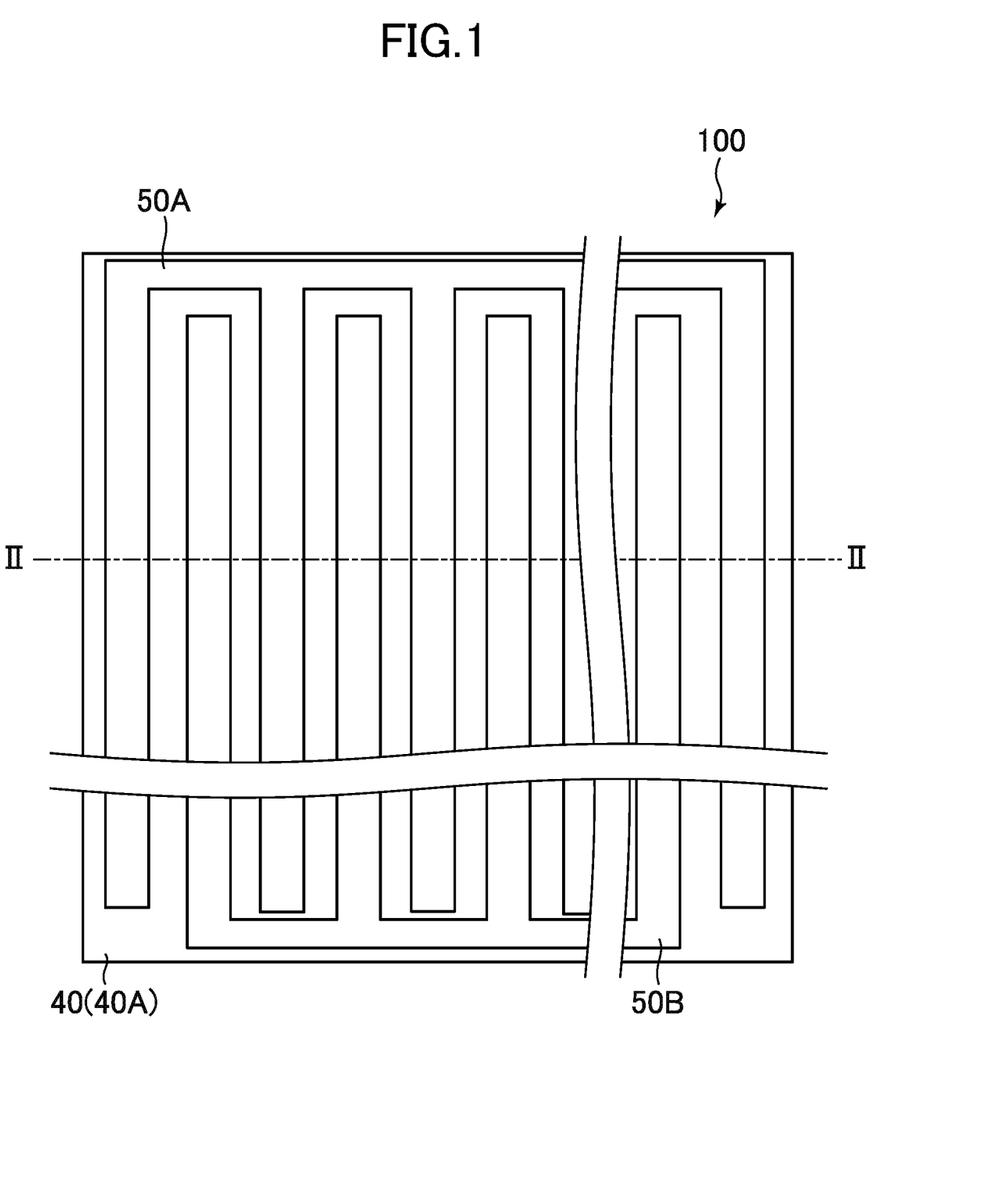
FIG. 1 is a plan view for illustrating a back side of a photovoltaic device according to an embodiment of the present disclosure.

FIG. 1 is a plan view for illustrating a back side of a photovoltaic device 100 according to this embodiment.

The photovoltaic device 100 according to this embodiment includes a semiconductor substrate having formed, on a back surface thereof, an electrode film 50A for a first conductivity type and an electrode film 50B for a second conductivity type are formed as illustrated in FIG. 1. In other words, the photovoltaic device 100 according to this embodiment is a back contact solar cell, and collects generated carriers on the back side, which is opposite from a light receiving surface.

In this embodiment, the electrode film 50A for the first conductivity type and the electrode film 50B for the second conductivity type are each shaped like a comb, and have a structure in which comb teeth of the electrode film 50B for the second conductivity type are inserted into spaces between comb teeth of the electrode film 50A for the first conductivity type.

On the back side of the photovoltaic device 100, an transformed portion 40A of a protective film 40 is formed by insulation treatment to cover the back surface of the semiconductor substrate in regions in which no electrode film 50A for the first conductivity type and no electrode film 50B for the second conductivity type are formed.

Figure 2:
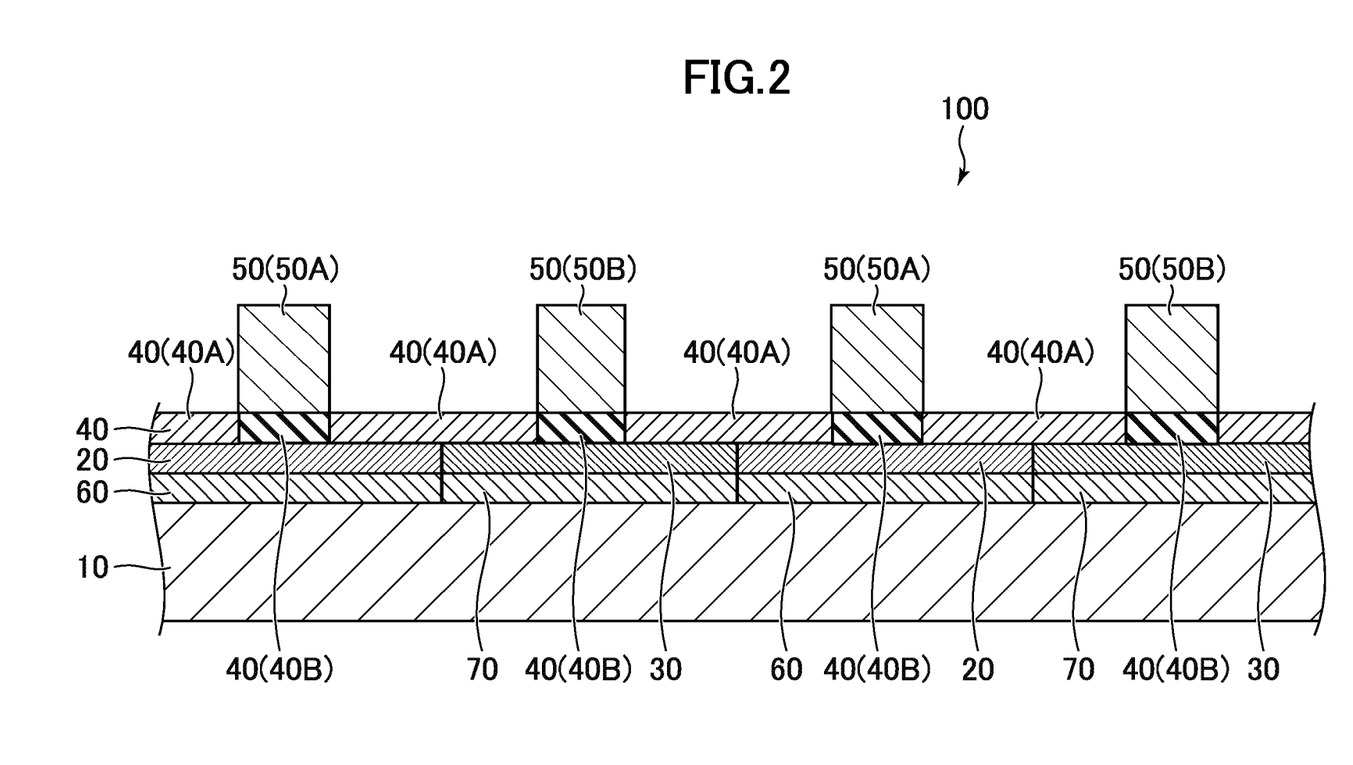
FIG. 2 is a sectional view taken along the line II-II of FIG. 1.

FIG. 2 is a sectional view taken along the line II-II of FIG. 1. In FIG. 2, the light receiving side and the back side in the photovoltaic device 100 are illustrated in a lower part and an upper part, respectively.

As illustrated in FIG. 2, the photovoltaic device 100 according to this embodiment has a configuration in which a first-conductivity-type semiconductor film 20 and a second-conductivity-type semiconductor film 30 are provided on the back side of a semiconductor substrate 10.

The first-conductivity-type semiconductor film 20 and the second-conductivity-type semiconductor film 30 in this embodiment are provided in regions different, in plan view, from each other on the back side of the semiconductor substrate 10. A placement illustrated in FIG. 9 may be employed in which a part of the first-conductivity-type semiconductor film 20 and a part of the second-conductivity-type semiconductor film 30 are overlapped with each other in plan view.

The protective film 40 is formed on the back sides of the first-conductivity-type semiconductor film 20 and the second-conductivity-type semiconductor film 30. The protective film 40 has a function of protecting back surfaces of the first-conductivity-type semiconductor film 20 and the second-conductivity-type semiconductor film 30.

The back surfaces of the first-conductivity-type semiconductor film 20 and the second-conductivity-type semiconductor film 30 are electrically connected to the electrode films 50 via the protective film 40. The protective film 40 is thus formed from a conductive material to establish electric connection of the first-conductivity-type semiconductor film 20 and the second-conductivity-type semiconductor film 30 to the electrode films 50. Presence of the protective film 40 also keeps metal atoms from spreading from the electrode films 50 to the first-conductivity-type semiconductor film 20 and the second-conductivity-type semiconductor film 30.

The protective film 40, which is formed from a conductive material as described above, includes the transformed portion 40A, which is non-conductive and inhibits conduction between the back surface of the first-conductivity-type semiconductor film 20 and the back surface of the second-conductivity-type semiconductor film 30. That is, the protective film 40 includes a conductive portion 40B electrically connected to the electrode films 50 and the non-conductive transformed portion 40A. In this embodiment, the non-conductive transformed portion 40A is provided at least along a conduction path between the back surface of the first-conductivity-type semiconductor film 20 and the back surface of the second-conductivity-type semiconductor film 30.

Figure 9:
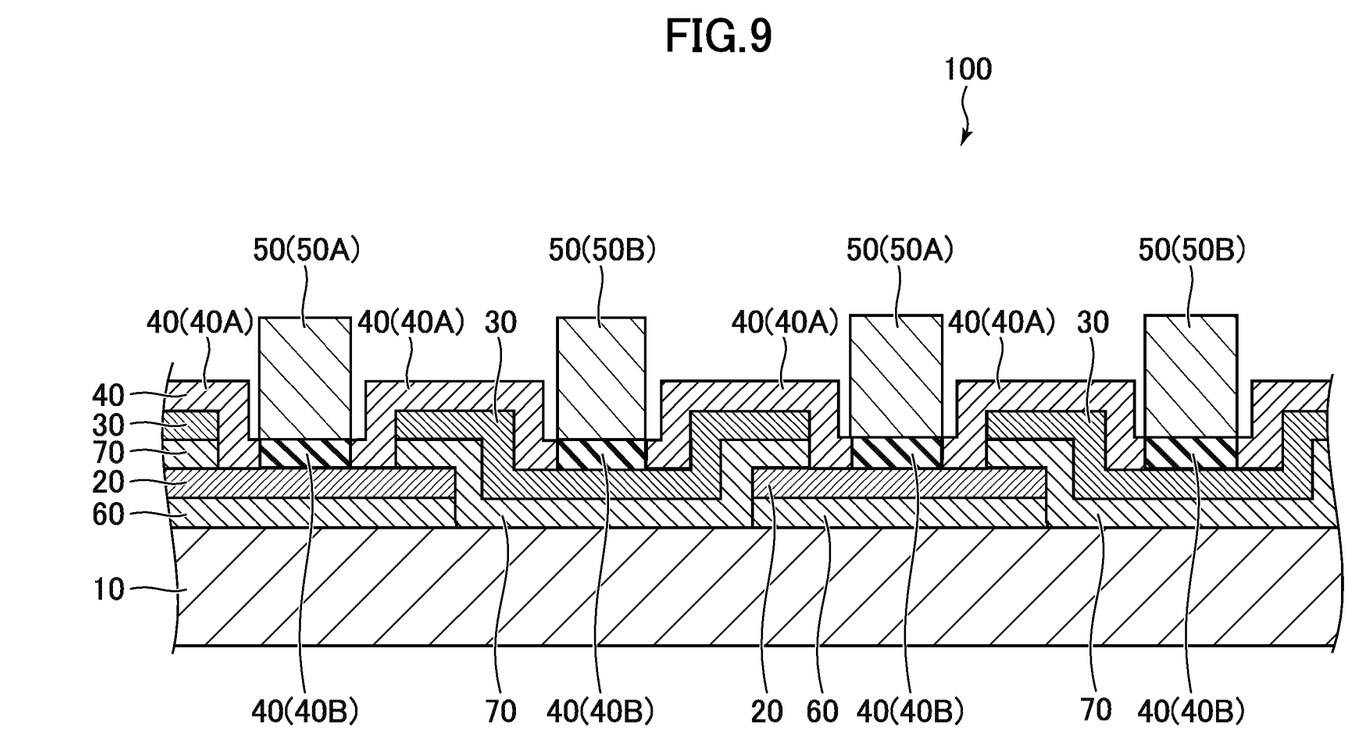
FIG. 9 is a sectional view for illustrating another example of carrying out the photovoltaic device according to this embodiment.

The non-conductive transformed portion 40A inhibiting conduction between the back surface of the first-conductivity-type semiconductor film 20 and the back surface of the second-conductivity-type semiconductor film 30 is included also in the configuration illustrated in FIG. 9, in which a part of the first-conductivity-type semiconductor film 20 and a part of the second-conductivity-type semiconductor film 30 are overlapped with each other in plan view. Specifically, the non-conductive transformed portion 40A stretches at least from a side surface of the second-conductivity-type semiconductor film 30 layered on the back side of the first-conductivity-type semiconductor film 20 to the back surface of the first-conductivity-type semiconductor film 20. That is, the transformed portion 40A is provided along a conduction path between the back surface of the first-conductivity-type semiconductor film 20 and the back surface of the second-conductivity-type semiconductor film 30.

This configuration allows the transformed portion 40A of the protective film 40 to prevent a short circuit between the first-conductivity-type semiconductor film 20 and the second-conductivity-type semiconductor film 30 while the protective film 40 protects the surfaces of the first-conductivity-type semiconductor film 20 and the second-conductivity-type semiconductor film 30. The photovoltaic device 100 according to this embodiment is consequently improved in long-term reliability.

A more specific configuration of the photovoltaic device according to this embodiment is described below.

As illustrated in FIG. 2, the photovoltaic device 100 according to this embodiment includes the semiconductor substrate 10. A substrate made of crystalline silicon, for example, is prepared as the semiconductor substrate 10. An example in which the semiconductor substrate 10 is an n-type semiconductor substrate is described in this embodiment.

A first intrinsic semiconductor film 60 is provided in portions of the back surface of the semiconductor substrate 10. The first-conductivity-type semiconductor film 20 is provided on a back surface of the first intrinsic semiconductor film 60. The first intrinsic semiconductor film 60 and the first-conductivity-type semiconductor film 20 are arranged to substantially entirely overlap with each other in plan view. The first-conductivity-type semiconductor film 20 may be a p-type semiconductor film or an n-type semiconductor film. In this embodiment, an example in which the first-conductivity-type semiconductor film 20 is a p-type semiconductor film is described. Holes generated in the semiconductor substrate 10 are taken out in the first-conductivity-type semiconductor film 20, which is a p-type semiconductor film.

A second intrinsic semiconductor film 70 is provided in regions of the back surface of the semiconductor substrate 10 in which no first intrinsic semiconductor film 60 is formed. The second-conductivity-type semiconductor film 30 is provided on a back surface of the second intrinsic semiconductor film 70. The second intrinsic semiconductor film 70 and the second-conductivity-type semiconductor film 30 are arranged to substantially entirely overlap with each other in plan view. At least a part of the second-conductivity-type semiconductor film 30 is provided in a position different, in plan view, from the position of the first-conductivity-type semiconductor film 20. The second-conductivity-type semiconductor film 30 may be a p-type semiconductor film or an n-type semiconductor film, but has a conductivity type opposite to the conductivity type of the first-conductivity-type semiconductor film 20. The second-conductivity-type semiconductor film 30 in the example described in this embodiment is an n-type semiconductor film.

In the configuration illustrated in FIG. 9, the second intrinsic semiconductor film 70 is arranged to partially overlap with the back surface of the first-conductivity-type semiconductor film 20. The second-conductivity-type semiconductor film 30, which is arranged to overlap with the second intrinsic semiconductor film 70 in plan view, and the first-conductivity-type semiconductor film 20 are arranged to at least partially overlap with each other in plan view. In this configuration, too, at least a part of the second-conductivity-type semiconductor film 30 is provided in a position different, in plan view, from the position of the first-conductivity-type semiconductor film 20.

As illustrated in FIG. 2, the protective film 40 is formed on exposed surfaces of the first-conductivity-type semiconductor film 20 and the second-conductivity-type semiconductor film 30. The protective film 40 is a transparent conductive film containing, as its component, at least one selected from the group consisting of indium oxide, zinc oxide, tin oxide, and titanium oxide.

The electrode films 50 are formed on the back side of the conductive portion 40B of the protective film 40. At least a part of the back surface of the first-conductivity-type semiconductor film 20 is electrically connected to the electrode film 50 via the conductive portion 40B of the protective film 40. The electrode film 50 that is to be electrically connected to the first-conductivity-type semiconductor film 20 is the electrode film 50A for the first conductivity type.

At least a part of the back surface of the second-conductivity-type semiconductor film 30 is electrically connected to the electrode film 50 via the conductive portion 40B of the protective film 40. The electrode film 50 that is to be electrically connected to the second-conductivity-type semiconductor film 30 is the electrode film 50B for the second conductivity type.

The electrode film 50A for the first conductivity type and the electrode film 50B for the second conductivity type contain, as their component, at least one of copper and silver, for example.

As described above, the protective film 40 is formed from a conductive material to establish electric connection between the first-conductivity-type semiconductor film 20 and the electrode film 50A for the first conductivity type, and electric connection between the second-conductivity-type semiconductor film 30 and the electrode film 50B for the second conductivity type, but includes the non-conductive transformed portion 40A, which inhibits conduction between the back surface of the first-conductivity-type semiconductor film 20 and the back surface of the second-conductivity-type semiconductor film 30.

In this embodiment, the transformed portion 40A is non-conductive on the whole due to a physical boundary generated in a crystal, a rise in potential barrier, or an extreme drop in carrier density. The physical boundary is, for example, a crack developed in a crystal. The rise in potential barrier and the extreme drop in carrier density occur when, for example, the protective film 40 contains indium oxide, and the contained indium oxide is subjected to reduction. A compound generated by the reduction of indium oxide is considerably disorderly in crystal structure and composition both, and is accordingly incapable of exerting conductivity. The reduction of indium may be performed, for example, by plasma treatment.

The non-conductive transformed portion 40A is provided along a conduction path between the back surface of the first-conductivity-type semiconductor film 20 and the back surface of the second-conductivity-type semiconductor film 30. With the non-conductive transformed portion 40A provided at least in a boundary region between the first-conductivity-type semiconductor film 20 and the second-conductivity-type semiconductor film 30, a short circuit between the first-conductivity-type semiconductor film 20 and the second-conductivity-type semiconductor film 30 can be prevented. In this embodiment, the protective film 40 has the transformed portion 40A in all regions except a region between the electrode film 50A for the first conductivity type and the first-conductivity-type semiconductor film 20 and a region between the electrode film 50B for the second conductivity type and the second-conductivity-type semiconductor film 30.

This configuration allows the transformed portion 40A of the protective film 40 to prevent a short circuit between the first-conductivity-type semiconductor film 20 and the second-conductivity-type semiconductor film 30 while the protective film 40 protects the surfaces of the first-conductivity-type semiconductor film 20 and the second-conductivity-type semiconductor film 30. The photovoltaic device 100 is consequently improved in long-term reliability.

[Method of Manufacturing the Photovoltaic Device 100]

A method of manufacturing the photovoltaic device 100 according to this embodiment is described below with reference to FIG. 2 to FIG. 8. FIG. 2 to FIG. 8 are sectional views taken along the line II-II of FIG. 1. In FIG. 2 to FIG. 8, the light receiving side and the back side in the photovoltaic device 100 are illustrated in a lower part and an upper part, respectively.

[Semiconductor Substrate Preparation Step]

Figure 3:
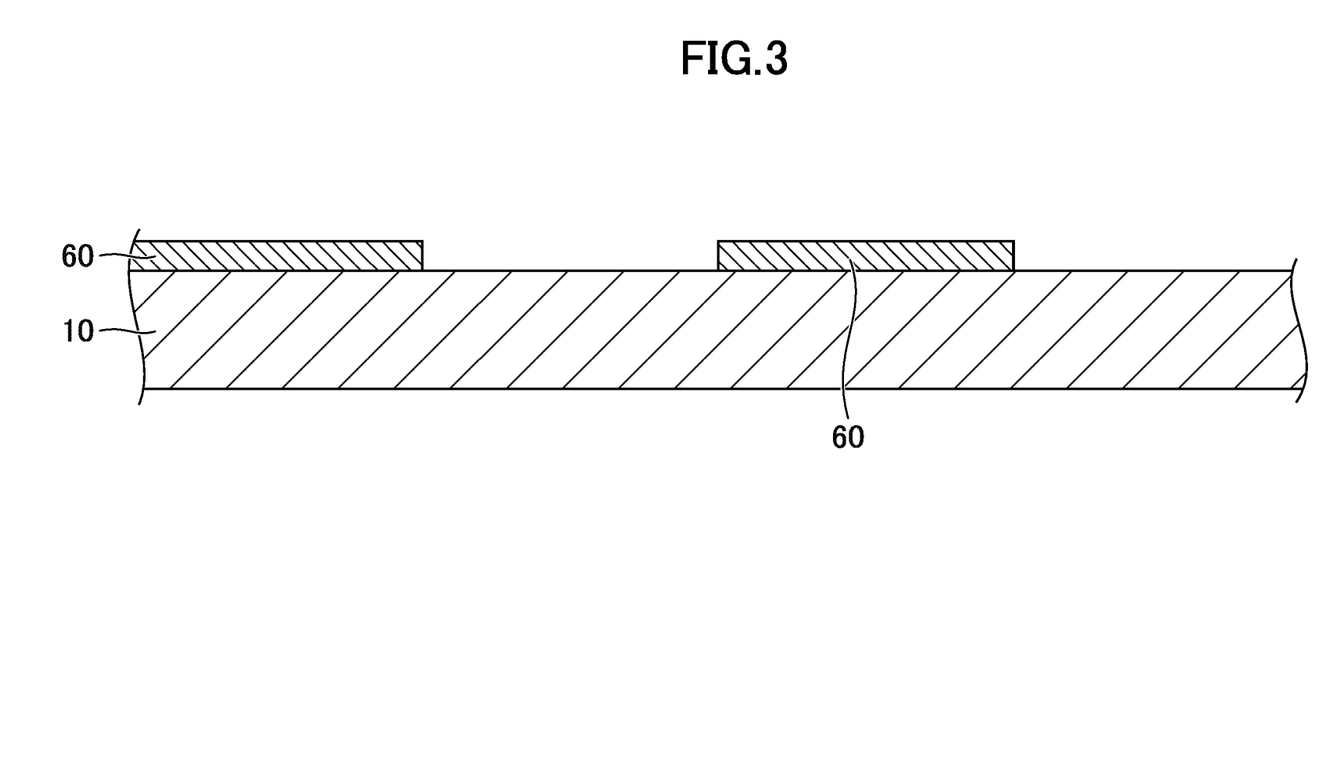
FIG. 3 is a sectional view for illustrating a method of manufacturing the photovoltaic device according to this embodiment.

As illustrated in FIG. 3, the semiconductor substrate 10 is prepared first. A single-crystal silicon substrate, for example, may be used as the semiconductor substrate 10. The single-crystal silicon substrate to be used may be an n-type single-crystal silicon substrate or a p-type single-crystal silicon substrate. However, an n-type single-crystal silicon substrate is preferred because of the long lifetime of carriers in the crystalline substrate. This is because, while light-induced degradation (LID) in which light irradiation causes boron (B) as a p-type dopant to form a recombination center may occur in p-type single-crystal silicon, the use of an n-type single-crystal silicon substrate as the semiconductor substrate 10 keeps LID from occurring.

It is preferred for the single-crystal silicon substrate to be used as the semiconductor substrate 10 to have a thickness of 50 μm to 200 μm. A thickness of 60 μm to 180 μm is more preferred, and a thickness of 70 μm to 180 μm is even more preferred. The material cost can be lowered more with the use of a substrate that has a thickness in this range.

The semiconductor substrate 10 is preferred to have a concave-convex structure called a texture structure on its incident side from the viewpoint of optical confinement.

The semiconductor substrate 10 is also preferred to have a passivation film and an antireflection film in the stated order on the incident side of the semiconductor substrate 10, namely, the side illustrated in the lower part of FIG. 3. The passivation film may be any type of film that is capable of keeping carriers from recombining and capable of terminating surface defects. However, an intrinsic silicon film is preferred as the passivation film. A light-transmissive film having a refractive index of about 1.5 to about 2.3 is preferred as the antireflection film. A particularly preferred antireflection film is a film of SiO, SiN, or SiON. While the method of forming the antireflection film is not particularly limited, it is preferred for the antireflection film to be formed by chemical vapor deposition (CVD), which allows precise control of film thickness. In film forming by CVD, the film quality can be controlled by controlling material gas and film forming conditions.

[First Intrinsic Semiconductor Film Forming Step]

As illustrated in FIG. 3, the first intrinsic semiconductor film 60 is formed next on the back surface of the semiconductor substrate 10 by, for example, plasma CVD. The first intrinsic semiconductor film 60 is formed in the same regions as regions in which the first-conductivity-type semiconductor film 20 is to be formed in a first-conductivity-type semiconductor film forming step described later.

With the first intrinsic semiconductor film 60 formed between the first-conductivity-type semiconductor film 20 and the semiconductor substrate 10, surface defects of the semiconductor substrate 10 are terminated to improve the lifetime, and the overall output from the photovoltaic device 100 is consequently improved.

[First-Conductivity-Type Semiconductor Film Forming Step]

Figure 4:
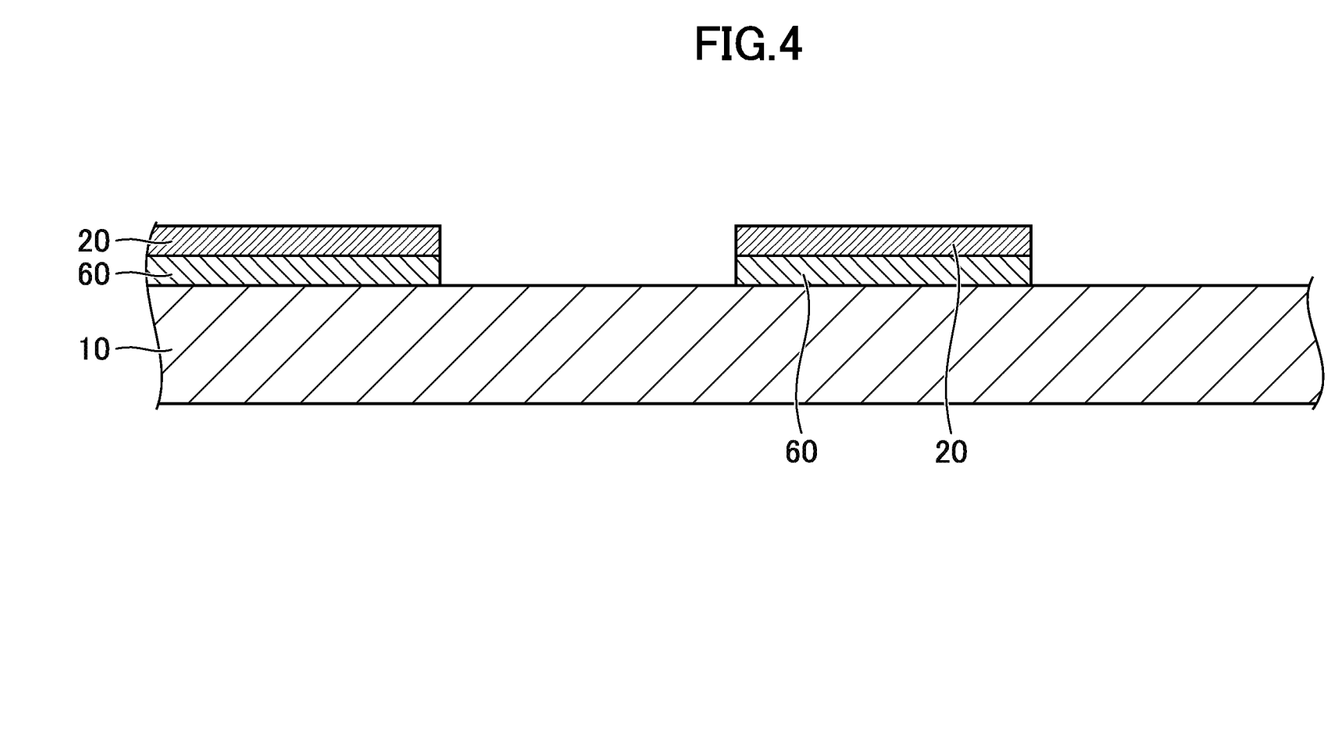
FIG. 4 is a sectional view for illustrating the method of manufacturing the photovoltaic device according to this embodiment.

As illustrated in FIG. 4, the first-conductivity-type semiconductor film 20 is formed next on the back surface of the first intrinsic semiconductor film 60 by, for example, plasma CVD. The first-conductivity-type semiconductor film 20 is formed to substantially entirely overlap with the first intrinsic semiconductor film 60 in plan view. The first-conductivity-type semiconductor film 20 may be a p-type semiconductor film or an n-type semiconductor film. The first-conductivity-type semiconductor film 20 in the example described in this embodiment is a p-type semiconductor film.

Materials used to form the first-conductivity-type semiconductor film 20 desirably include an amorphous silicon film containing an amorphous component, for example, an amorphous silicon thin film or a microcrystalline silicon (a thin film containing amorphous silicon and crystalline silicon). Boron (B) or the like may be used as a dopant impurity.

How the first-conductivity-type semiconductor film 20 is formed is not particularly limited and CVD, for example, may be used. The use of CVD allows the first-conductivity-type semiconductor film 20 and the second-conductivity-type semiconductor film 30 to be formed in the same plane. In the case of using CVD, $SiH_4$ gas is used and $B_2H_6$ diluted with hydrogen is preferred as gas doped with a dopant. A minute dose of dopant impurity is sufficient, and a mixture gas diluted with $SiH_4$ or $H_2$ in advance is accordingly preferred. In the film forming of the first-conductivity-type semiconductor film 20, gas containing a heterogeneous element, such as $CH_4$, $CO_2$, $NH_3$, and $GeH_4$, may be added to alloy a silicon-based thin film and to thereby change an energy gap of the silicon-based thin film. A minute dose of oxygen, carbon, or similar impurity may also be added in order to improve the transmittivity of light. This is accomplished by introducing $CO_2$, $CH_4$, or similar gas during the film forming by CVD.

[Second Intrinsic Semiconductor Film Forming Step]

Figure 5:
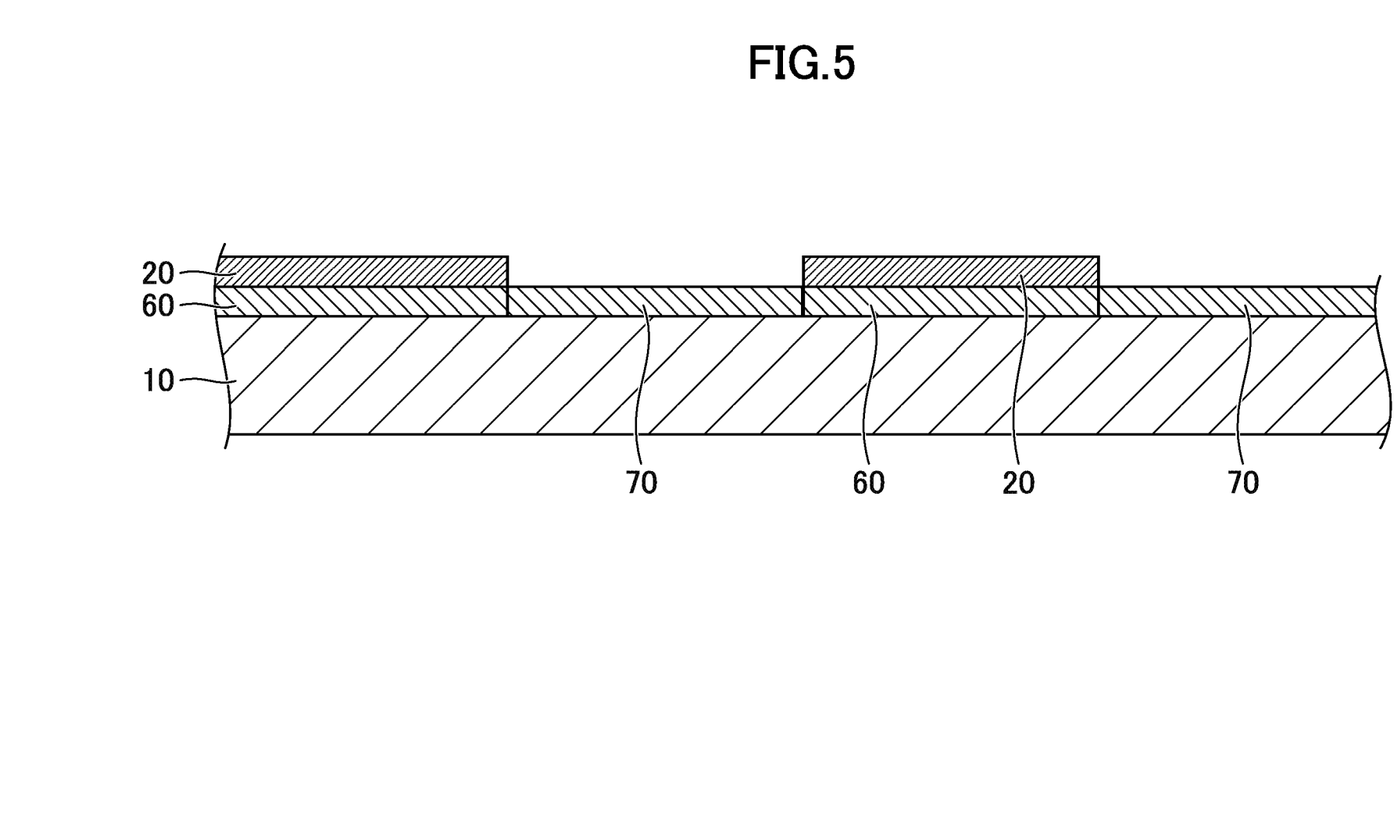
FIG. 5 is a sectional view for illustrating the method of manufacturing the photovoltaic device according to this embodiment.

As illustrated in FIG. 5, the second intrinsic semiconductor film 70 is formed next by, for example, plasma CVD in regions of the back surface of the semiconductor substrate 10 in which no first intrinsic semiconductor film 60 is formed. In other words, at least a part of the second intrinsic semiconductor film 70 is formed in a position different, in plan view, from the position of the first-conductivity-type semiconductor film 20.

In the case of manufacturing the configuration that is illustrated in FIG. 9, the second intrinsic semiconductor film 70 is formed to extend from the regions in which no first intrinsic semiconductor film 60 is formed and overlap with a part of the back surface of the first-conductivity-type semiconductor film 20.

[Second-Conductivity-Type Semiconductor Film Forming Step]

Figure 6:
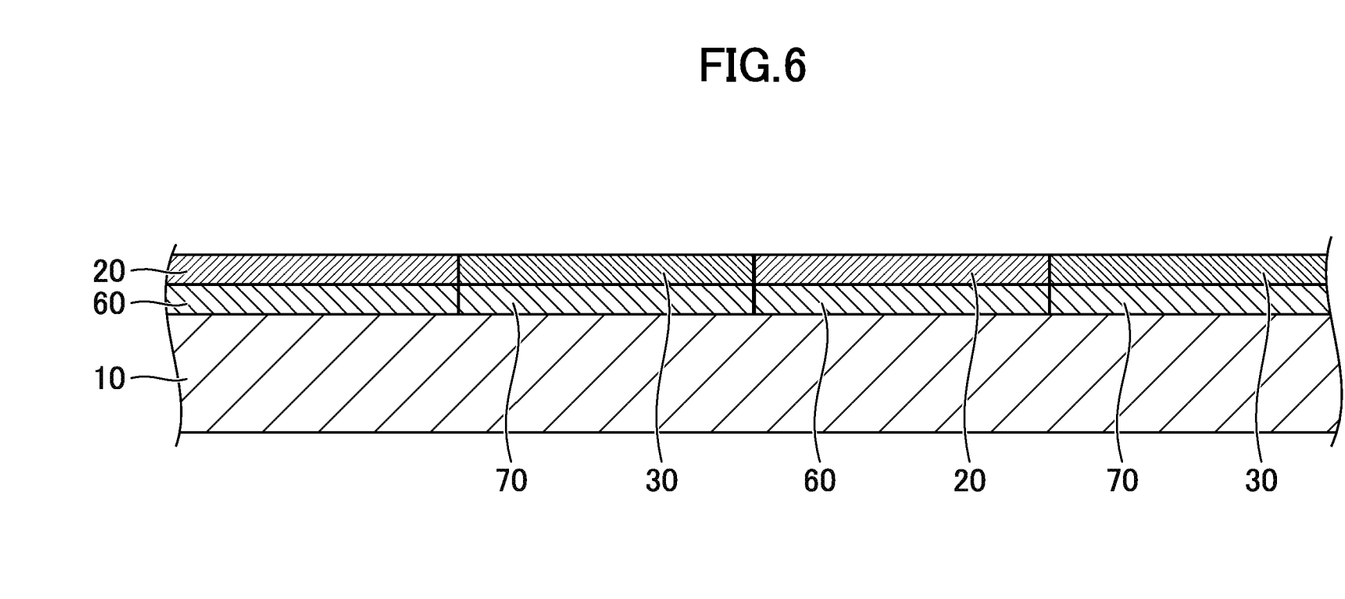
FIG. 6 is a sectional view for illustrating the method of manufacturing the photovoltaic device according to this embodiment.

As illustrated in FIG. 6, the second-conductivity-type semiconductor film 30 is formed next on the back surface of the second intrinsic semiconductor film 70 by, for example, plasma CVD. The second-conductivity-type semiconductor film 30 is formed to substantially entirely overlap with the second intrinsic semiconductor film 70 in plan view. At least a part of the second-conductivity-type semiconductor film 30 is provided in a position different, in plan view, from the first-conductivity-type semiconductor film 20.

In the case of manufacturing the configuration that is illustrated in FIG. 9, because the second intrinsic semiconductor film 70 is formed to overlap with a part of the back surface of the first-conductivity-type semiconductor film 20 in the second intrinsic semiconductor film forming step, the second-conductivity-type semiconductor film 30, which is formed to overlap with the second intrinsic semiconductor film 70 in plan view, is formed to overlap at least partially with the first-conductivity-type semiconductor film 20 in plan view. At least a part of the second-conductivity-type semiconductor film 30 is provided in a position different, in plan view, from the position of the first-conductivity-type semiconductor film 20 in the case of manufacturing the configuration of FIG. 9 as well.

The second-conductivity-type semiconductor film 30 may be a p-type semiconductor film or an n-type semiconductor film, but has a conductivity type opposite to the conductivity type of the first-conductivity-type semiconductor film 20. The second-conductivity-type semiconductor film 30 in the example described in this embodiment is an n-type semiconductor film.

Materials used to form the second-conductivity-type semiconductor film 30 desirably include an amorphous silicon film containing an amorphous component, for example, an amorphous silicon thin film or a microcrystalline silicon. Phosphorus (P) or the like may be used as dopant impurity.

How the second-conductivity-type semiconductor film 30 is formed is not particularly limited and CVD, for example, may be used. The use of CVD allows the first-conductivity-type semiconductor film 20 and the second-conductivity-type semiconductor film 30 to be formed in the same plane. In the case of using CVD, $SiH_4$ gas is used and $PH_3$ diluted with hydrogen is preferred as gas doped with a dopant. A minute dose of dopant impurity is sufficient, and mixture gas diluted with $SiH_4$ or $H_2$ in advance is accordingly preferred. In the film forming of the first-conductivity-type semiconductor film 20, gas containing a heterogeneous element, such as $CH_4$, $CO_2$, $NH_3$, and $GeH_4$, may be added to alloy a silicon-based thin film and to thereby change an energy gap of the silicon-based thin film. A minute dose of oxygen, carbon, or similar impurity may also be added in order to improve the transmittivity of light. This is accomplished by introducing $CO_2$, $CH_4$, or similar gas during the film forming by CVD.

[Protective Film Forming Step]

Figure 7:
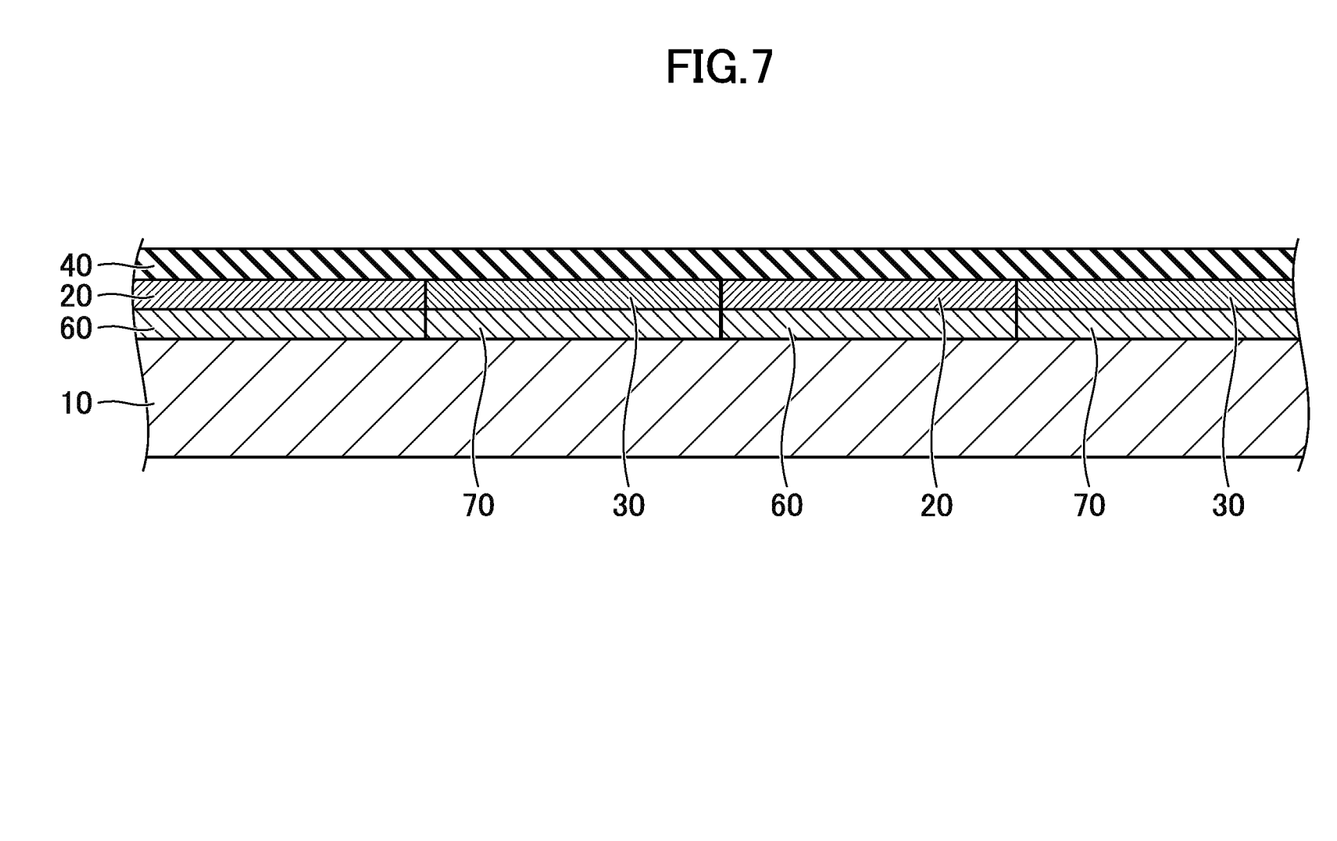
FIG. 7 is a sectional view for illustrating the method of manufacturing the photovoltaic device according to this embodiment.

As illustrated in FIG. 7, the protective film 40 is formed next on the back surfaces of the first-conductivity-type semiconductor film 20 and the second-conductivity-type semiconductor film 30 by sputtering, MOCVD, or other method. A component of the protective film 40 is a transparent conductive metal oxide, examples of which include indium oxide, zinc oxide, tin oxide, titanium oxide, and a complex oxide of those materials. Of the examples of the component given above, an indium-based complex oxide having indium oxide as a main component is preferred for the protective film 40 from the viewpoint of high conductivity and transparency. It is also preferred to use indium oxide doped with a dopant in order to secure reliability and even higher conductivity. Examples of impurity used as the dopant include Sn, W, Ce, Zn, As, Al, Si, S, and Ti.

Being formed by sputtering, MOCVD, or the like, the protective film 40 is formed uniformly on the exposed back surfaces of the first-conductivity-type semiconductor film 20 and the second-conductivity-type semiconductor film 30. The protective film 40 is formed continuously from the back surface of the first-conductivity-type semiconductor film 20 to the back surface of the second-conductivity-type semiconductor film 30 and, at this point, the back surface of the first-conductivity-type semiconductor film 20 and the back surface of the second-conductivity-type semiconductor film 30 are electrically connected by the protective film 40.

In the case of manufacturing the configuration that is illustrated in FIG. 9, the protective film 40 is formed continuously from the back surface of the first-conductivity-type semiconductor film 20 to the back surface of the second-conductivity-type semiconductor film 30 and, at this point, the back surface of the first-conductivity-type semiconductor film 20 and the back surface of the second-conductivity-type semiconductor film 30 are electrically connected by the protective film 40.

[Electrode Film Forming Step]

Figure 8:
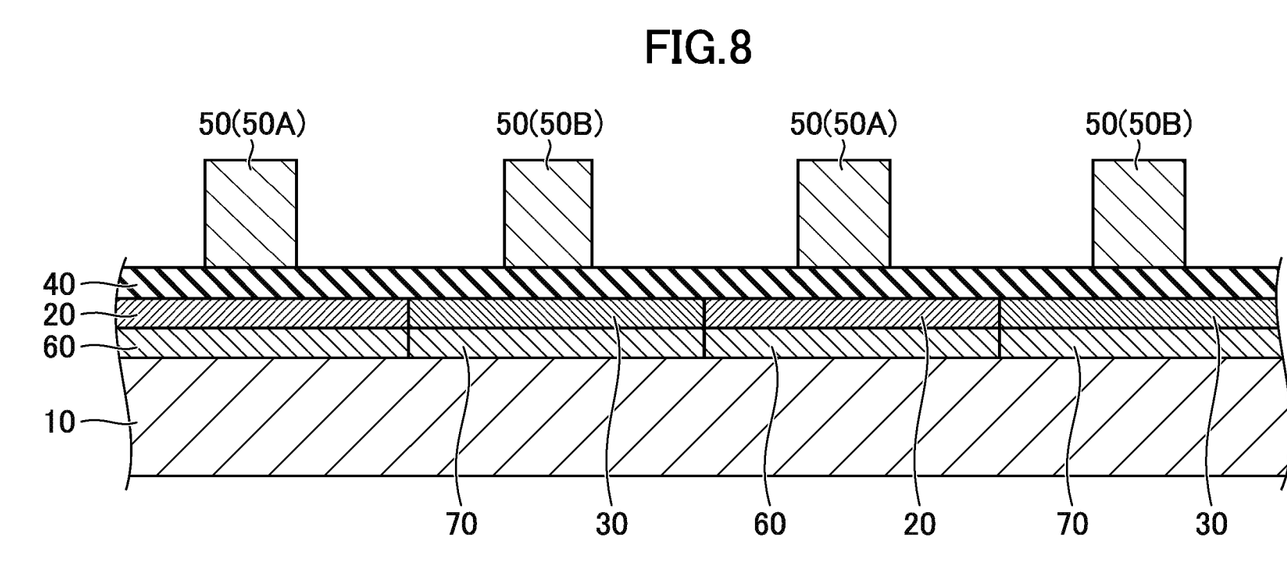
FIG. 8 is a sectional view for illustrating the method of manufacturing the photovoltaic device according to this embodiment.

As illustrated in FIG. 8, the electrode film 50A for the first conductivity type is formed next on the back side of the conductive protective film 40. The electrode film 50A for the first conductivity type is electrically connected to the first-conductivity-type semiconductor film 20 via the protective film 40, which is formed from a transparent conductive film.

Further, the electrode film 50B for the second conductivity type is formed on the back side of the conductive protective film 40. The electrode film 50B for the second conductivity type is electrically connected to the second-conductivity-type semiconductor film 30 via the protective film 40, which is formed from a transparent conductive film.

A component of the electrode film 50A for the first conductivity type and the electrode film 50B for the second conductivity type is, for example, copper or silver. When copper is used as the component, a resist is formed in advance in regions in which no electrode films 50 are to be formed, the electric connection from the protective film 40 is utilized to form the electrode films 50 by electrolytic plating, and then the resist is removed. When silver is used as the component, the electrode films 50 are formed from silver paste by screen printing.

The materials of the electrode film 50A for the first conductivity type and the electrode film 50B for the second conductivity type are not particularly limited as long as the materials include at least a metal electrode film. The method of forming the electrode films 50 is not particularly limited as well. The metal electrode film may generally be formed by a known technology such as an ink jet method, screen printing, conductive wire bonding, spraying, vacuum evaporation, and sputtering. A silver electrode formed from silver paste by printing and a copper plated electrode formed by electrolytic plating are preferred.

[Transformed Portion Forming Step]

As illustrated in FIG. 2, the non-conductive transformed portion 40A, which inhibits conduction between the back surface of the first-conductivity-type semiconductor film 20 and the back surface of the second-conductivity-type semiconductor film 30, is formed next in a part of the protective film 40. In this embodiment, the transformed portion 40A is formed at least along a conduction path between the back surface of the first-conductivity-type semiconductor film 20 and the back surface of the second-conductivity-type semiconductor film 30.

In the configuration illustrated in FIG. 9, too, the non-conductive transformed portion 40A is formed to inhibit conduction between the back surface of the first-conductivity-type semiconductor film 20 and the back surface of the second-conductivity-type semiconductor film 30. The non-conductive transformed portion 40A in the configuration of FIG. 9 is formed from a side surface of the second-conductivity-type semiconductor film 30 layered on the back side of the first-conductivity-type semiconductor film 20 to the back surface of the first-conductivity-type semiconductor film 20. That is, the transformed portion 40A is formed along a conduction path between the back surface of the first-conductivity-type semiconductor film 20 and the back surface of the second-conductivity-type semiconductor film 30.

The transformed portion 40A may be formed by, for example, irradiating the protective film 40 with laser light. The irradiation of the protective film 40 with laser light generates a physical boundary, which results in non-conductivity.

As an example of conditions under which the protective film 40 is irradiated with laser light, a pulse laser having a wavelength of 308 nm is used, the thickness of the protective film 40 is set to 100 nm, and a region of the protective film 40 in which the transformed portion 40A is to be formed is irradiated with light from the pulse laser at a pulse width of 150 ns.

In the step of forming transformed portion, for the purpose of preventing a short circuit between the back surface of the first-conductivity-type semiconductor film 20 and the back surface of the second-conductivity-type semiconductor film 30, it is sufficient to perform laser irradiation on the conduction path between the back surface of the first-conductivity-type semiconductor film 20 and the back surface of the second-conductivity-type semiconductor film 30. However, the back surface of the protective film 40 and the back surfaces of the electrode films 50 are entirely irradiated with laser light in this embodiment.

A merit of a manufacturing method, in which the entire back surface is irradiated with laser light, resides in that laser irradiation can be performed without positioning the electrode films 50 to the protective film 40, thereby improving manufacturing efficiency.

In addition, the electrode films 50 irradiated with laser light function as masks and allow a portion of the protective film 40 that is interposed between the electrode film 50A for the first conductivity type and the first-conductivity-type semiconductor film 20 and a portion of the protective film 40 that is interposed between the electrode film 50B for the second conductivity type and the second-conductivity-type semiconductor film 30 to remain untransformed and keep their original conductivity. Accordingly, a configuration in which a short circuit between the back surface of the first-conductivity-type semiconductor film 20 and the side surface of the second-conductivity-type semiconductor film 30 is prevented while the electric connection between the first-conductivity-type semiconductor film 20 and the electrode film 50A for the first conductivity type and the electric connection between the second-conductivity-type semiconductor film 30 and the electrode film 50B for the second conductivity type are maintained is accomplished in a single step by this laser irradiation step.

Another merit is that, because the manufacturing method does not include the separation of a transparent conductive film by etching, no margin for the separation is required, which improves the degree of freedom in designing the photovoltaic device 100.

While the method described in this embodiment uses laser irradiation of the protective film 40 to form the transformed portion 40A, another method may be employed in which plasma treatment is performed in a hydrogen atmosphere or a methane atmosphere to subject indium to reduction in the transformed portion 40A, to thereby raise the resistance of the transformed portion 40A. The plasma treatment may be performed with use of, for example, hydrogen plasma, and the electrodes are kept from being etched by adding a minute amount of compound-based gas such as methane, diborane, silane, and phosphine, approximately 0.01% to approximately 3%, during the plasma treatment.

This method, which uses plasma treatment in a hydrogen atmosphere or a methane atmosphere, has the same merits as the ones described above as the merits of the manufacturing method that uses laser irradiation. That is, this method does not require the positioning of the electrode films 50 to the protective film 40 and can accordingly improve manufacturing efficiency. This method also gives the electrodes 50 the function of a mask, which allows a portion of the protective film 40 that is interposed between the electrode film 50A for the first conductivity type and the first-conductivity-type semiconductor film 20 and a portion of the protective film 40 that is interposed between the electrode film 50B for the second conductivity type and the second-conductivity-type semiconductor film 30 to remain untransformed and keep their original conductivity. Accordingly, a configuration in which a short circuit between the back surface of the first-conductivity-type semiconductor film 20 and the side surface of the second-conductivity-type semiconductor film 30 is prevented while the electric connection between the first-conductivity-type semiconductor film 20 and the electrode film 50A for the first conductivity type and the electric connection between the second-conductivity-type semiconductor film 30 and the electrode film 50B for the second conductivity type are maintained is accomplished in a single step by the plasma treatment. This method further has a merit in that, as the method does not involve the separation of a transparent conductive film by etching, no margin for the separation is required, which improves the degree of freedom in designing the photovoltaic device 100.

However, the method that uses laser irradiation to form the transformed portion 40A is preferred because the use of laser irradiation eliminates the need for a vacuum process, and there is no risk of altering the electrode film 50A for the first conductivity type and the electrode film 50B for the second conductivity type from exposure to gas. Laser irradiation is preferred also in that the irradiated portion can be kept small when the transformed portion 40A is to be generated locally in the protective film 40.

The invention claimed is:

1. A method of manufacturing a photovoltaic device, comprising the steps of:
    forming a first-conductivity-type semiconductor film on a back side of a semiconductor substrate;
    forming a second-conductivity-type semiconductor film in which at least a part thereof is provided in a position different, in plan view, from a position of the first-conductivity-type semiconductor film on the back side of the semiconductor substrate;

forming a protective film as a conductive film on a back side of the first-conductivity-type semiconductor film and a back side of the second-conductivity-type semiconductor film;

forming an electrode film on a back side of the protective film; and forming a transformed portion as a non-conductive portion in the protective film on a back surface of the first-conductivity-type semiconductor film and a back surface of the second-conductivity-type semiconductor film.

2. The method of manufacturing a photovoltaic device according to claim 1, wherein, in the step of forming the transformed portion, the transformed portion is formed by laser irradiation.

3. The method of manufacturing a photovoltaic device according to claim 1, wherein, in the step of forming the transformed portion, the electrode film is used as a mask to avoid forming the transformed portion in a connection portion of the protective film in which the protective film is connected to the electrode film.

4. The method of manufacturing a photovoltaic device according to claim 2, wherein, in the step of forming the transformed portion, the laser irradiation is performed on a portion of the protective film that is on the back surface of the first-conductivity-type semiconductor film and the back surface of the second-conductivity-type semiconductor film.

5. The method of manufacturing a photovoltaic device according to claim 1, wherein, in the step of forming the transformed portion, the transformed portion is formed by plasma treatment.

6. The method of manufacturing a photovoltaic device according to claim 5, wherein, in the step of forming the transformed portion, the plasma treatment is performed in a hydrogen atmosphere or a methane atmosphere.

7. The method of manufacturing a photovoltaic device according to claim 1, wherein, in the step of forming the protective film, at least one material selected from the group consisting of indium oxide, zinc oxide, tin oxide, and titanium oxide is used to form the protective film.

8. The method of manufacturing a photovoltaic device according to claim 1, wherein, in the step of forming the electrode film, copper or silver is used to form the electrode film.

9. The method of manufacturing a photovoltaic device according to claim 8, wherein, in the step of forming the electrode film, the electrode film is formed by electrolytic plating using copper as a material.

\* \* \* \* \*